United States Patent [19]

Arisaka

[11] Patent Number: 5,102,352

[45] Date of Patent: Apr. 7, 1992

[54] HIGH FREQUENCY ELECTRICAL CONNECTOR COMPRISING MULTILAYER CIRCUIT BOARD

[75] Inventor: Hiroshi Arisaka, Tokyo, Japan

[73] Assignee: Kel Corporation, Tokyo, Japan

[21] Appl. No.: 641,757

[22] Filed: Jan. 17, 1991

[30] Foreign Application Priority Data

Jan. 18, 1990 [JP] Japan .................................. 2-9069
Dec. 12, 1990 [JP] Japan .................................. 2-411370

[51] Int. Cl.⁵ ...................... H01R 9/07; H01R 13/648
[52] U.S. Cl. ...................................... 439/608; 439/65; 439/47
[58] Field of Search .......................... 439/45–48, 439/75, 608, 92, 108, 109; 174/267; 361/410, 416

[56] References Cited

U.S. PATENT DOCUMENTS

| | | | |
|---|---|---|---|
| 3,208,029 | 9/1965 | Leslie | 439/46 |
| 3,932,932 | 1/1976 | Goodman | 29/625 |
| 4,208,080 | 6/1980 | Teagno | 439/45 |
| 4,494,172 | 1/1985 | Leary et al. | 174/267 |
| 4,859,806 | 8/1989 | Smith | 439/75 |

FOREIGN PATENT DOCUMENTS

86961 8/1983 European Pat. Off. .

Primary Examiner—Gary F. Paumen
Attorney, Agent, or Firm—Robert W. J. Usher

[57] ABSTRACT

A high frequency electrical connector for an integrated circuit such as a microprocessor comprises a board assembly comprising a series of conductive and insulating layers of preselected thicknesses arranged alternately, one on top of the other, with conductive layers adjacent front and rear faces. Ground and current source pins are implanted in the layers with connecting portions for external circuitry outstanding from at least one of the faces and with conductive layer contacting portions establishing electrical connection with selected conductive layers. Ground pins connect the conductive layers adjacent the front and rear faces providing front and rear ground shield layers. The layers may be corrugated providing shielding portions extending in the direction of the pins. The thicknesses of the layers and the separation of the pins are preselected to provide pin impedances matching those of other connecting devices.

12 Claims, 5 Drawing Sheets

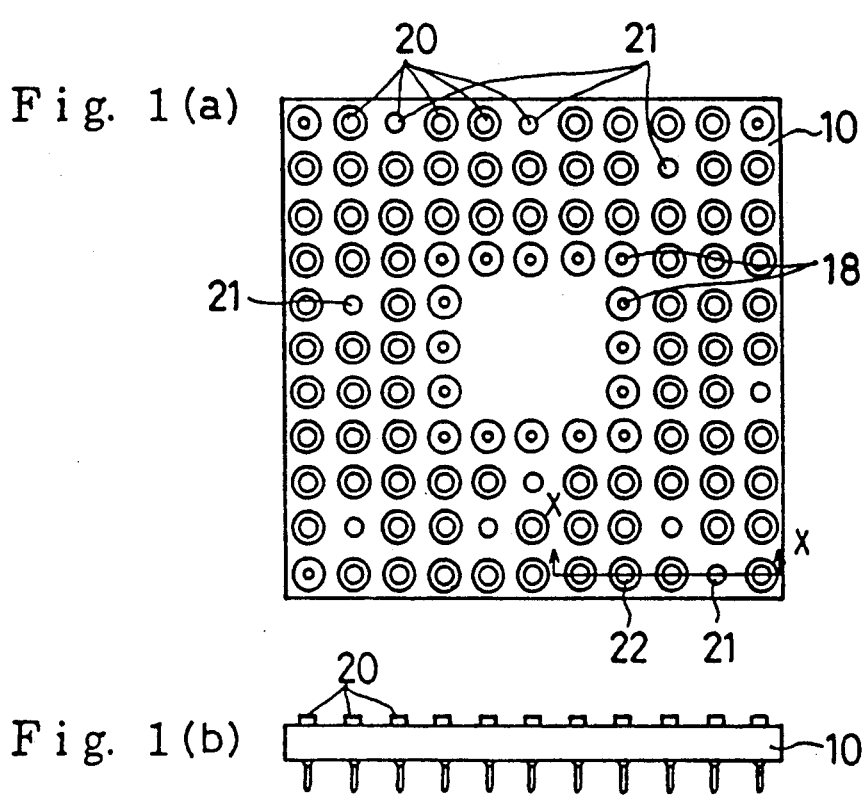
Fig. 1(a)
Fig. 1(b)
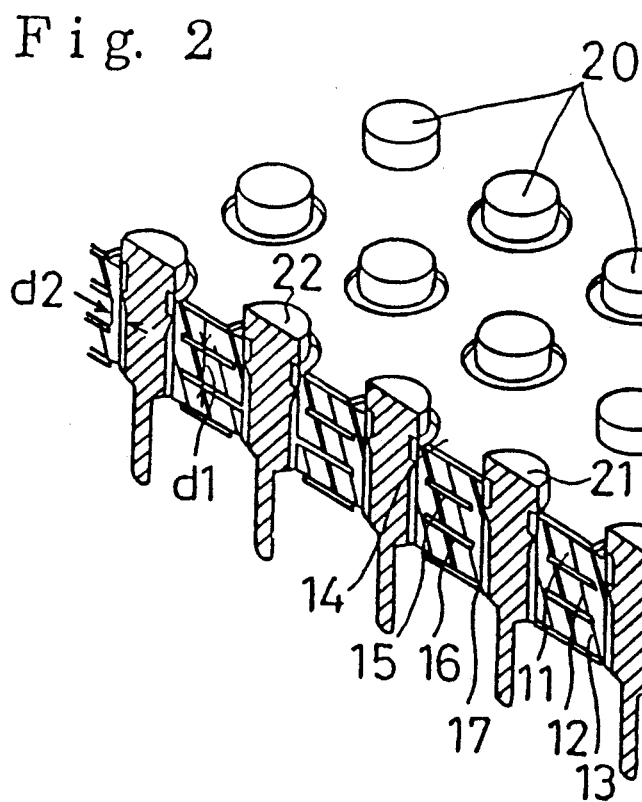
Fig. 2

HIGH FREQUENCY ELECTRICAL CONNECTOR COMPRISING MULTILAYER CIRCUIT BOARD

FIELD OF THE INVENTION

The invention relates to a high frequency electrical connector for integrated circuits, particularly for microprocessors.

BACKGROUND OF THE INVENTION

In recent years, the density of integrated circuits, particularly those of microprocessors, has increased greatly enabling relatively massive quantities of data to be processed within a single integrated circuit. This has led to a commensurate increase in the amount and speed of data transferred externally of the integrated circuit together with increase in the number and density of integrated circuit pins enabling such data transfer, in particular, enabling the parallel transmission of large quantities of data. The consequential extreme miniaturization and very high clock frequencies of central processing units, thinness and close spacing of pins has increased the possibility of cross-talk between pins and, with the increasing switching speeds, the current flow from such high speed switching has dramatically increased in the high frequency range. As a result, in current supply circuits, variations in the source voltage can easily occur producing false switching signals in the electronic circuits. Furthermore, the increased frequency of the signals has increased the difficulty of controlling the impedance between the pins increasing the risk of impedance mismatch with other circuits connected thereto.

EP-A-86 961 discloses a multilayer board for the interconnection of high-speed circuits in which a first voltage layer is sandwiched between two ground layers at a close spacing to produce a large distributed capacitance inhibiting switching signals from causing voltage spikes in the power lines and reducing the inductance of the conductive layers thereby improving the characteristic impedance of the board.

However, this prior proposal suffers from disadvantages concerning, for example, effective shielding of board mounted components and cost of manufacture.

Other multilayer circuit boards are known, for example from U.S. Pat. No. 4,489,999, which teaches a flexible board assembly integral with an interconnect socket and U.S. Pat. No. 4,208,080, which teaches a stack of terminal board sandwiched between rigid housing parts for current distribution in an automobile.

SUMMARY OF THE INVENTION

An object of the invention is to provide a high frequency electrical connector for connection to circuitry of an integrated circuit while alleviating cross-talk between pins, reducing the impedance of current source and ground lines and affording impedance matching of signal lines.

According to one aspect of the invention, there is provided a high frequency electrical connector for an integrated circuit such as a microprocessor comprising:

a board assembly having front and rear faces and comprising a series of conductive and insulating layers of preselected thicknesses arranged alternately, with conductive layers adjacent front and rear faces;

a plurality of ground and current source pins having respective conductive layer contacting portions and connecting portions and being anchored in the board assembly with connecting portions outstanding from at least one of the faces and with conductive layer contacting portions extending through the layers establishing electrical connection with selected conductive layers, at least some of the ground pins establishing electrical connection with the conductive layers adjacent the front and rear faces providing front and rear ground shield layers and the current source pins establishing electrical connection with selected of the conductive layers located between the front and rear ground shield layers providing respective power layers.

The presence of the ground layers adjacent the faces of the board assembly shields board mounted or board adjacent components from adverse inductive effects from the currents carried by the board.

Preferably, at least one of the ground pins establishes electrical connection with both the front and the rear ground shield layers.

In one example, at least some pins include socket forming portions opening to one face for mating connection with respective leads of a microprocessor.

Desirably, at least one of the conductive layers has a portion which extends in the direction of the pins, transversely of the board assembly, at a location spaced apart from and between adjacent pins, thereby to shield said adjacent pins. The transversely extending shielding portion may be formed by a corrugation in said at least one conductive layer, preferably, the layers are corrugated, which corrugations provide rows of transversely extending shielding portions between rows of adjacent pins.

In another example, at least some of the ground and current source pins each have connecting portions constituted by male elements extending from respective opposite ends of the conductive layer contacting portion.

In the connector of the invention, the conductive layers provide shields resulting in a considerable decrease in cross-talk between pins which is further reduced where a portion or portions of the conducted layers extends in the direction of the pins at locations between the pins, more completely to surround and isolate the pins from adjacent pins.

In addition, as the conductive layers are connected with current source or ground pins, the impedances of both the current source and ground lines connected to the conductive layers are greatly reduced. Furthermore, alterations in the thicknesses of the insulating or dielectric layers and the separation of both the conductive layers and the signal pins enables the impedance of the signal pins to be adjusted preset to match impedance of other circuits.

BRIEF DESCRIPTION OF THE DRAWINGS

Specific examples of the invention will now be described with reference to the accompanying drawings in which:

FIG. 1(a) and (b) are plan and side views, respectively, of a first example of integrated circuit socket connector for a pin grid array;

FIG. 2 is a schematic perspective view partly in cross-section taken along line X—X of FIG. 1;

DESCRIPTION OF THE PREFERRED EMBODIMENTS

Figure 3:
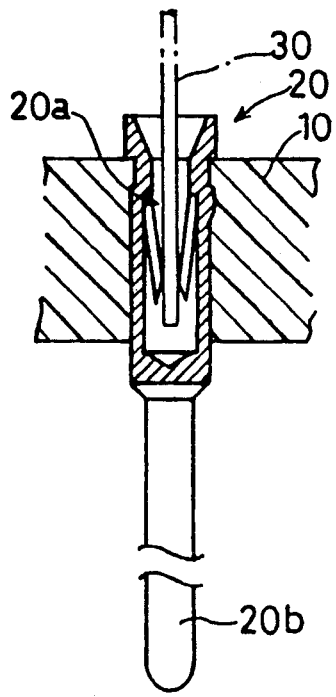
FIG. 3 is an elevational view, partly cut away, of a socket pin shown in FIGS. 1 and 2.

In the first example of connector shown in FIGS. 1-3, a laminated board assembly 10, manufactured in the same manner as conventional printed circuit boards, comprises a series of insulating or dielectric layers 11, 12 and 13 arranged alternately in overlying relation with respective conductive layers 14, 15, 16 and 17, the conductive layers 14 and 17 defining the front and rear surfaces of the board assembly. Preselected layers of the board assembly connect with socket pins 20 pushed into plated through-holes in the board, the conductive layers 14 and 17 at the front and rear of the board assembly, respectively, both being connected to a ground socket pin 21; the conductive layer 16 enclosed between the two dielectric layers 12 and 13, being connected to the current source pin 22; and, the conductive layer 15, enclosed between the two dielectric layers 11 and 12, being connected to another current source pin 23, through which a voltage is applied which is different from the voltage applied to the current source pin 22.

Holes 18, shown by concentric circles in FIG. 1(a), are for receiving non-functional or polarizing pins characteristic of a selected type of integrated circuit plugged into the socket connector.

As shown in FIG. 3, each socket pin 20 is formed with a receptacle portion 20a for receiving a pin 30 of the mating integrated circuit for electrical connection thereto. Male, plug forming, elements 20b are integrally formed with the receptacle portion to extend axially therefrom and outstand from a rear surface of the board assembly for receipt in holes in another circuit board carrying other circuit elements on which the socket connector carrying the integrated circuit are to be mounted.

The capacitance C between two conductors arranged in spaced apart in to-face relation is generally given by the formula:

$$C = EA/d$$

where a is the surface area of the facing parts of the two conductors, d is the distance between the conductors, and E is the permittivity of the dielectric or insulating material enclosed between the two conductors. The impedance is expressed by the formula:

$$Z = 1/(2\pi fC)$$

where f is the frequency.

Therefore, the selection of a suitable thickness d1 of the dielectric layers 11, 12, and 13 and a suitable distance d2 between the conductors 14, 15, 16 and 17 and the socket pins 20 during manufacture, a suitable impedance for the socket pins 20 can be predetermined enabling the impedance to be matched with other circuits to be connected to the socket pins 20.

Figure 4:
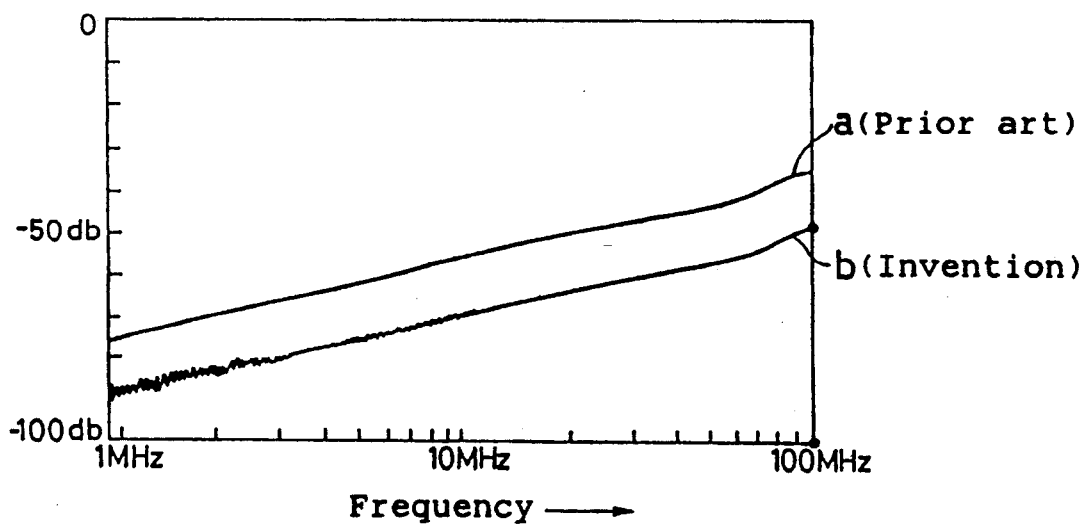
FIG. 4 is a graph showing empirical data concerning cross-talk between adjacent signal pins of the connector shown in FIGS. 1-3 and of a connector of the prior art.

In the graph shown in FIG. 4, the curve 'a' represents results achieved from a conventional device formed only from a dielectric layer and the curve b, the results from the connector of FIGS. 1-3. The separation of the socket pins in both the conventional connector and the connector of the inventions was 2.54 mm while the thicknesses of the dielectric layers 11, 12, and 13 were 0.5 mm, 0.9 mm, and 0.5 mm, respectively.

As shown by the graph, at higher frequencies, the cross-talk between adjacent socket pins is improved by $\frac{1}{4}$ to 1/5 in the connector of the invention compared with the conventional connector.

Figure 5:
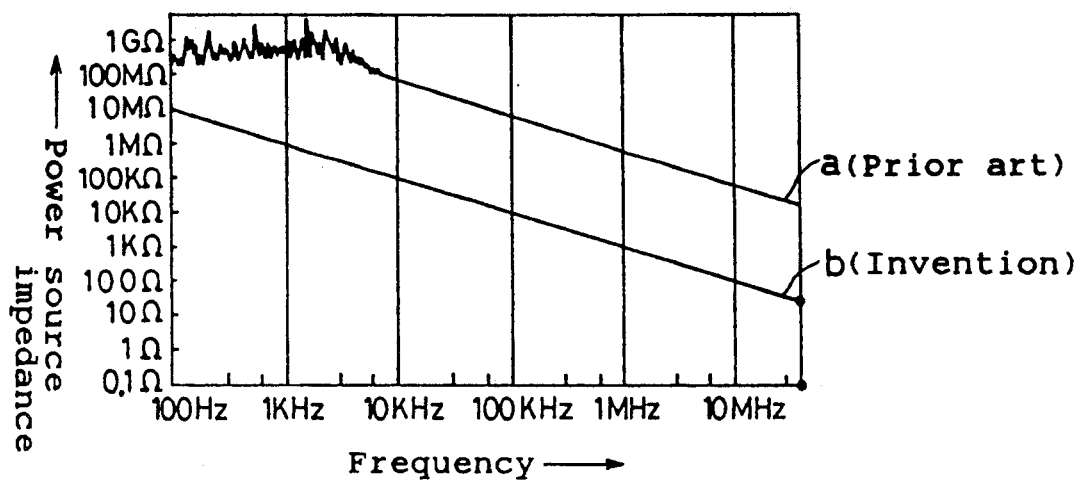
FIG. 5 is a graph showing empirical data concerning the impedance of the current source line of the connector as shown in FIGS. 1-3 and the impedance of a conventional device.

Furthermore, as shown in the graph of FIG. 5 where the curves a and b represent the conventional connector and the connector of FIGS. 1-3, respectively, the impedance of the current source line of the connector of the invention is nearly three orders of magnitude lower than that of the conventional connector.

Thus, in the connector of the invention, the cross-talk between adjacent pins is decreased, the impedance between the current source and ground pins is lowered, and, by preselecting a suitable thickness d1 for the dielectric layers 11, 12, and 13 and a distance d2 between the socket pins 20 and the conductors 14, 15, 16, and 17, the impedance of the socket pins can be set appropriately.

Although, in the connector described with reference to FIGS. 1-3, the socket pins are simply pushed into holes in the board 10, it will be appreciated that the socket pins can also be anchored in the board by a soldering technique. Furthermore, it is possible to manufacture connectors specifically for various integrated circuits by preselecting a suitable pattern for the conductive layers and the positions and sizes of the holes.

Figure 7:
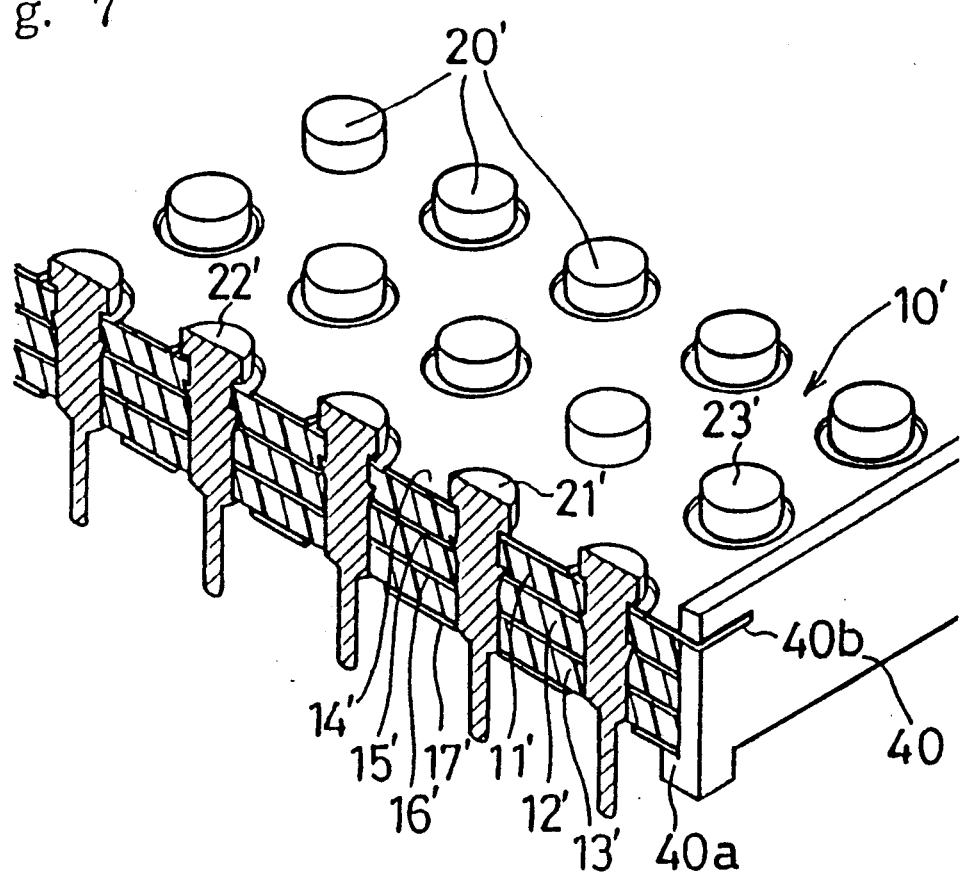
FIG. 7 is a schematic perspective view, partly in cross-section along lines Y-Y of FIG. 6.
Figure 6A:
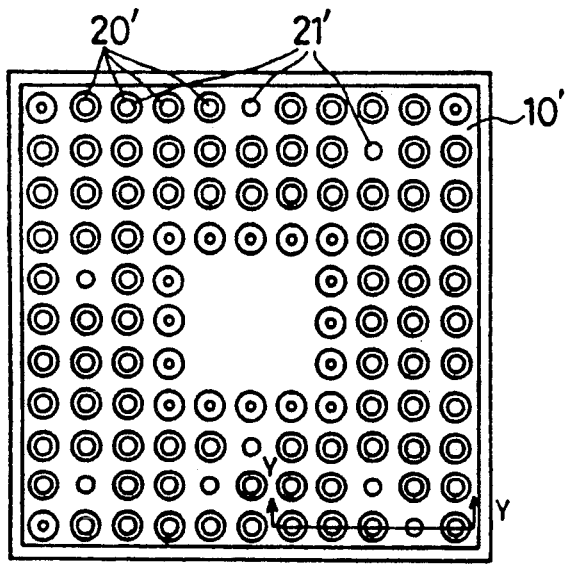
FIG. 6(a) and (b) are plan and elevational views of a second example of integrated socket for a pin grid array.
Figure 6B:
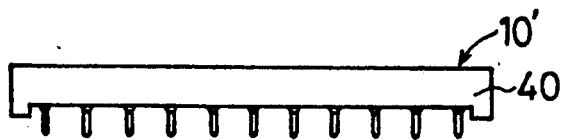

In the second example of connector shown in FIGS. 6 and 7, elements corresponding to those shown in FIGS. 1-3 are indicated by primed reference numerals.

In this example, the board assembly 10' is erected by stacking three, separately formed, dielectric boards or layers 11', 12', and 13' and four, separately formed, conducted boards 14', 15', 16', and 17' alternately on each other with the lowermost conductive board 17' placed on a projection 40a of a support frame 40 and the uppermost conductive board 14' inserted into a slit 40b formed in the frame 40, thereby retaining the stack of boards assembled together. The board through-holes are not plated, undersized holes in the conductive layers receiving the contacts in a force fit where connection is desired.

Figure 8:
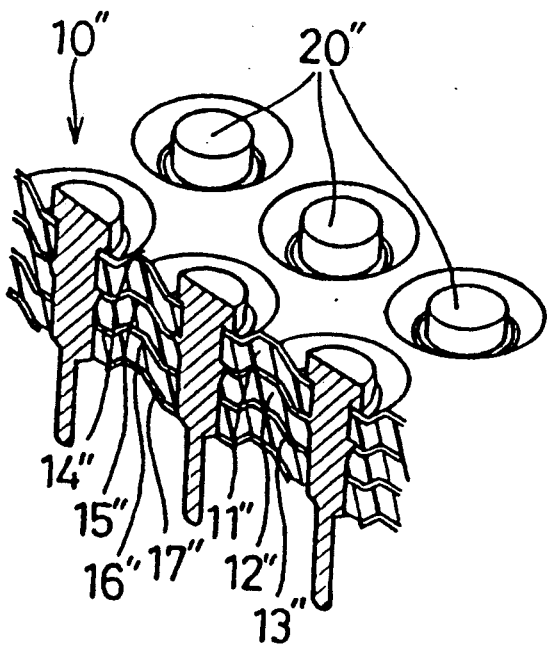
FIG. 8 is a schematic perspective view, partly in cross-section, showing a third example of the invention.

In the third example of the invention shown in FIG. 8, elements corresponding to those shown in FIGS. 1-3 are indicated by double primed numerals.

In this example, the dielectric boards 11", 12" and 13" and the conductive boards 14", 15", 16" and 17" constituting the board assembly 10" are corrugated or undulating providing portions extending in the direction of the socket pins at locations spaced apart from and between adjacent socket pins. This construction forms greater paths of separation of the socket pins 20" than the socket pins of the previous examples while the pins themselves are more completely surrounded by the conductive layer portions, increasing the effective shielding so that cross-talk is reduced still further.

Figure 9:
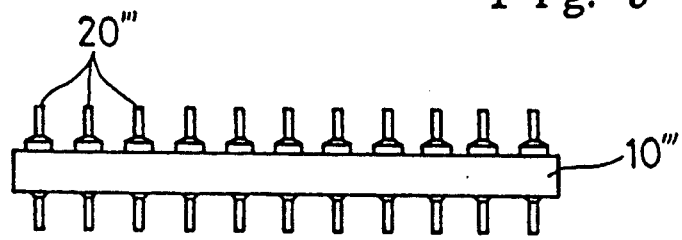
FIG. 9 is an elevational view of a further example of the invention.
Figure 10:
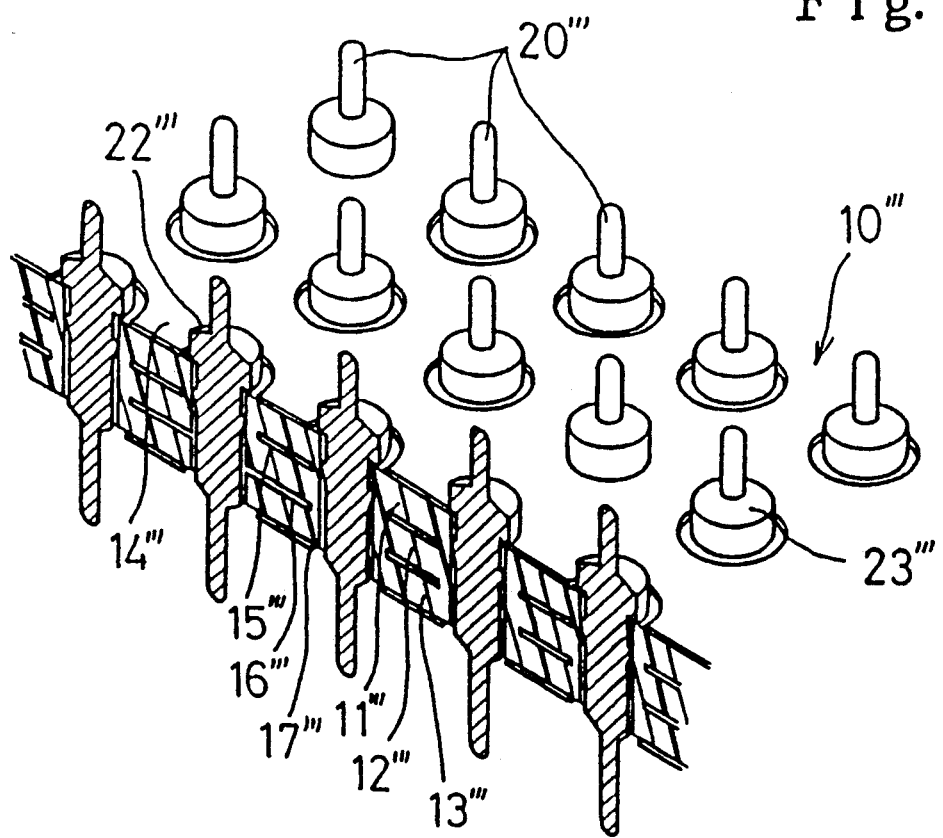
FIG. 10 is a schematic perspective view, partly in cross-section, of the connector of FIG. 9.

In the fourth example of the invention shown in FIGS. 9 and 10, elements corresponding to the elements of the first example of FIGS. 1-3 are indicated by triple primed reference numerals.

In this example, the connector 10''' constitutes a board-to-board connector. the pins 20''' include male, plug elements protruding from respective opposite ends of a central conductive layer engaging body portion of an increased diametrical size. The connector 10''' is mounted on a conventional printed circuit board by the male elements which protrude from first ends being soldered in through-holes of the conventional board while the male elements protruding from the second, opposite ends are plugged in receptacle portions of socket contacts of a connector of the type shown in FIG. 2, for example, which is itself mounted on another printed circuit board by the pin contact portions of the socket contacts thereof 20 being soldered in through holes of the other printed circuit board.

I claim:

1. A high frequency electrical connector for an integrated circuit such as a microprocessor comprising:
    a board assembly having front and rear faces and comprising a series of conductive and insulating layers of preselected thicknesses arranged alternately, with the conductive layers adjacent the front and rear faces;
    a plurality of ground and current source pins having respective conductive layer contacting portions and connecting portions and being inserted and anchored in the board assembly with the connecting portions outstanding from at least one of the faces and with the conductive layer contacting portions extending through the layers establishing electrical connection with selected said conductive layers, at least some of the ground pins establishing electrical connection with the conductive layers adjacent the front and rear faces thereby providing front and rear ground shield layers and the current source pins establishing electrical connection with selected ones of the conductive layers located between the front and rear ground shield layers thereby providing respective power layers, at least one of the ground pins establishing electrical connection with both the front and the rear ground shield layers.

2. A high frequency electrical connector according to claim 1, wherein at least some of the pins include socket forming portions opening to a face for mating connection with respective leads of a microprocessor.

3. A high frequency electrical connector according to claim 1, wherein, at least one of the conductive layers has a portion which extends in the direction of the pins, transversely of the board assembly, at a location spaced apart from and between adjacent pins, thereby to shield said adjacent pins.

4. A high frequency electrical connector according to claim 3, wherein the transversely extending shielding portion is formed by a corrugation in said at least one conductive layer.

5. A high frequency electrical connector according to claim 1, wherein the layers are corrugated, which corrugations provide rows of transversely extending shielding portions between rows of adjacent said pins.

6. A high frequency electrical connector according to claim 1, wherein at least some of the ground and current source pins each have connecting portions constituted by male elements extending from respective opposite ends of the conductive layer contacting portion.

7. A high frequency electrical connector for an integrated circuit such as a microprocessor comprising:
    a board assembly having front and rear faces and comprising a series of conductive and insulating layers of preselected thicknesses arranged alternately, with the conductive layers adjacent the front and rear faces;
    a plurality of ground and current source pins having respective conductive layer contacting portions and connecting portions and being inserted and anchored in the board assembly with the connecting portions outstanding from at least one of the faces and with the conductive layer contacting portions extending through the layers establishing electrical connection with selected said conductive layers, at least some of the ground pins establishing electrical connection with the conductive layers adjacent the front and rear faces thereby providing front and rear ground shield layers and the current source pins establishing electrical connection with selected ones of the conductive layers located between the front and rear ground shield layers thereby providing respective power layers, at least some of the pins include socket forming portions opening to a face for mating connection with respective leads of a microprocessor.

8. A high frequency electrical connector according to claim 7 wherein at least one of the ground pins establishes electrical connection with both the front and the rear ground shield layers.

9. A high frequency electrical connector according to claim 7, wherein at least one of the conductive layers has a portion which extends in the direction of the pins, transversely of the board assembly, at a location spaced apart from and between adjacent pins, thereby to shield said adjacent pins.

10. A high frequency electrical connector according to claim 9, wherein the transversely extending shielding portion is formed by a corrugation in said at least one conductive layer.

11. A high frequency electrical connector according to claim 7, wherein the layers are corrugated, which corrugations provide rows of transversely extending shielding portions between rows of adjacent said pins.

12. A high frequency electrical connector according to claim 7, wherein at least some of the ground and current source pins each have connecting portions constituted by male elements extending from respective opposite ends of the conductive layer contacting portion.

* * * * *